US010219386B2

(12) United States Patent
Drzaic et al.

(10) Patent No.: US 10,219,386 B2
(45) Date of Patent: Feb. 26, 2019

(54) DISPLAY AND MULTI-LAYER PRINTED CIRCUIT BOARD WITH SHARED FLEXIBLE SUBSTRATE

(71) Applicant: Apple Inc., Cupertino, CA (US)

(72) Inventors: Paul S. Drzaic, Morgan Hill, CA (US); Jeremy C. Franklin, San Francisco, CA (US); Stephen Brian Lynch, Portola Valley, CA (US); Scott A. Myers, Saratoga, CA (US); Benjamin M. Rappoport, Santa Barbara, CA (US); Fletcher R. Rothkopf, Los Altos, CA (US); John P. Ternus, Los Altos Hills, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/690,146

(22) Filed: Aug. 29, 2017

(65) Prior Publication Data

US 2017/0367190 A1    Dec. 21, 2017

Related U.S. Application Data

(62) Division of application No. 13/252,971, filed on Oct. 4, 2011, now Pat. No. 9,756,733.

(51) Int. Cl.
*H05K 1/18* (2006.01)
*G09G 3/20* (2006.01)
*G02F 1/1345* (2006.01)

(52) U.S. Cl.
CPC ............... *H05K 1/189* (2013.01); *G09G 3/20* (2013.01); *G02F 1/13452* (2013.01);
(Continued)

(58) Field of Classification Search
CPC ......... H05K 1/189; H05K 2201/10128; G09G 3/20; G09G 2300/0408; G09G 2300/0426; G02F 1/13452
See application file for complete search history.

(56) References Cited

U.S. PATENT DOCUMENTS 5,206,463 A * 4/1993 DeMaso .............. H05K 3/4691
174/254
7,705,812 B2   4/2010 Yuda et al.
(Continued)

FOREIGN PATENT DOCUMENTS

TW    201419973    5/2014
TW    201440582    10/2014
(Continued)

OTHER PUBLICATIONS

Adache, WO02010-070735 Japanese PCT Application, Jun. 2010, machine translation.
Raff et al., U.S. Appl. No. 13/452,061, filed Apr. 20, 2012.

*Primary Examiner* — Tracie Y Green
(74) *Attorney, Agent, or Firm* — Treyz Law Group, P.C.; Kendall W. Abbasi

(57) ABSTRACT

An electronic device may be provided with a display and a multi-layer printed circuit. Integrated circuits and other components may be mounted to the multi-layer printed circuit. The display and multi-layer printed circuit may share a common layer formed from a flexible substrate. The flexible substrate may have portions that are integrated into the display and portions that are integrated into the multi-layer printed circuit board. The flexible substrate may contain patterned conductive traces that are used to route signals from components in the multi-layer printed circuit to display circuitry such as a display driver integrated circuit. An array of thin-film transistors may be used to control the emission of light from the display and may be formed on portions of (Continued)

the flexible substrate that are integrated into the display. The display may be a flexible display that includes an array of organic light-emitting diodes.

20 Claims, 12 Drawing Sheets

(52) U.S. Cl.
CPC ............... *G09G 2300/0408* (2013.01); *G09G 2300/0426* (2013.01); *H05K 2201/10128* (2013.01)

(56) References Cited

U.S. PATENT DOCUMENTS

| | | | |
|---|---|---|---|
| 7,791,700 B2 * | 9/2010 | Bellamy | ............. G02F 1/13452 349/149 |
| 7,859,633 B2 | 12/2010 | Park | |
| 7,924,388 B2 | 4/2011 | Abe | |
| 8,072,764 B2 * | 12/2011 | Yeates | .................... H05K 1/117 361/748 |
| 8,207,908 B2 | 6/2012 | Yamazaki et al. | |
| 2003/0020844 A1 * | 1/2003 | Albert | ..................... G02F 1/167 349/33 |
| 2008/0108393 A1 | 5/2008 | Kim | |
| 2008/0137166 A1 | 6/2008 | Sah | |
| 2009/0302744 A1 | 12/2009 | Kim et al. | |
| 2010/0026952 A1 | 2/2010 | Miura et al. | |
| 2010/0244243 A1 | 9/2010 | Eya | |
| 2011/0169792 A1 | 7/2011 | Shimizu et al. | |
| 2011/0298396 A1 | 12/2011 | Kimura | |
| 2012/0146886 A1 | 6/2012 | Minami et al. | |
| 2014/0092338 A1 | 4/2014 | Miyazaki et al. | |

FOREIGN PATENT DOCUMENTS

| | | |
|---|---|---|
| WO | 20100070735 | 6/2010 |
| WO | 2013062707 | 5/2013 |

* cited by examiner

DISPLAY AND MULTI-LAYER PRINTED CIRCUIT BOARD WITH SHARED FLEXIBLE SUBSTRATE

This application is a division of U.S. patent application Ser. No. 13/252,971, filed Oct. 4, 2011, which is hereby incorporated by reference herein in its entirety.

BACKGROUND

This relates generally to electronic devices, and more particularly, to displays for electronic devices.

Electronic devices such as cellular telephones, computers, and media players are often provided with displays for displaying images to a user. In a typical display, an array of active image pixels is controlled by display driver circuitry using a pattern of orthogonal control lines.

The active image pixels form a rectangular active area in the center of the display. The active region in the center of the display is surrounded by an inactive border region. The inactive border region includes space for fanning out control lines from a centralized location at which a signal cable for the driver circuitry is attached. The signal cable may be a flexible printed circuit that is used to route signals from a main logic board or other printed circuit board to the driver circuitry. Typically, a conductive adhesive is used to mount one end of the signal cable to the display. A board-to-board connector is often used to connect the opposing end of the signal cable to a printed circuit board.

Ensuring that there is sufficient area to reliably attach the signal cable and to fan out the control lines along the edges of the active area may require a significant amount of inactive border area. It is not uncommon for the width of the inactive border to be up to a centimeter wide or more. This type of wide inactive region tends to make displays bulky and requires the use of electronic device housings with wide bezels. Connecting structures such as board-to-board connectors used to connect the signal cable to the printed circuit board may also add undesirable bulk to an electronic device.

It would therefore be desirable to be able to provide improved electronic devices.

SUMMARY

Electronic devices may be provided with a display and a multi-layer printed circuit. The multi-layer printed circuit board may be a flexible printed circuit, a rigid printed circuit board (PCB), or may have a combination of rigid and flexible layers (sometimes referred to as a "rigid-flex" printed circuit board). Integrated circuits and other components may be mounted on the multi-layer printed circuit.

The display and the multi-layer PCB may be provided with a shared flexible substrate layer. The flexible substrate may have a first portion that forms a layer in the display and a second portion that forms a layer in the multi-layer PCB. An array of thin-film transistors may be mounted on the first portion of the flexible substrate and may be used to control the emission of light from the display. Patterned conductive traces in the flexible substrate may be used to convey signals from components and circuitry in the multi-layer PCB to display circuitry such as display driver circuitry.

Vertical conductive structures such as vias may be used to form an electrical connection between layers in the multi-layer printed circuit and the second portion of the flexible substrate or between layers of the multi-layer printed circuit that are formed on opposing sides of the second portion of the flexible substrate.

In some configurations, the first portion of the flexible substrate may form an integrated layer of the display and the second portion may be attached to a printed circuit using a connecting structure such as a board-to-board connector. In other configurations, the first portion of the flexible substrate may be attached to the display using a conductive material (e.g., conductive adhesive, solder, etc.) and the second portion may form an integrated layer of a printed circuit.

If desired, the flexible substrate layer may form an integrated layer of a main logic board or other rigid logic board.

Further features of the invention, its nature and various advantages will be more apparent from the accompanying drawings and the following detailed description of the preferred embodiments.

DETAILED DESCRIPTION

A display may be provided for an electronic device such as a portable electronic device. Displays may be used to display visual information such as text and images to users.

Displays may be coupled to circuitry within the electronic device such as circuitry on a printed circuit board. For example, a display may contain driver circuitry that receives image data, control signals or other signals from a printed circuit board in the device. A flexible substrate layer may be used to convey image data and other signals from the printed circuit board to the driver circuitry in a display. The flexible substrate layer may have one portion that is directly integrated into the display (e.g., the flexible substrate may form a layer in the display). The flexible substrate layer may have a second portion that is directly integrated into the printed circuit board (e.g., the flexible substrate may form a layer in the printed circuit board).

Figure 1:
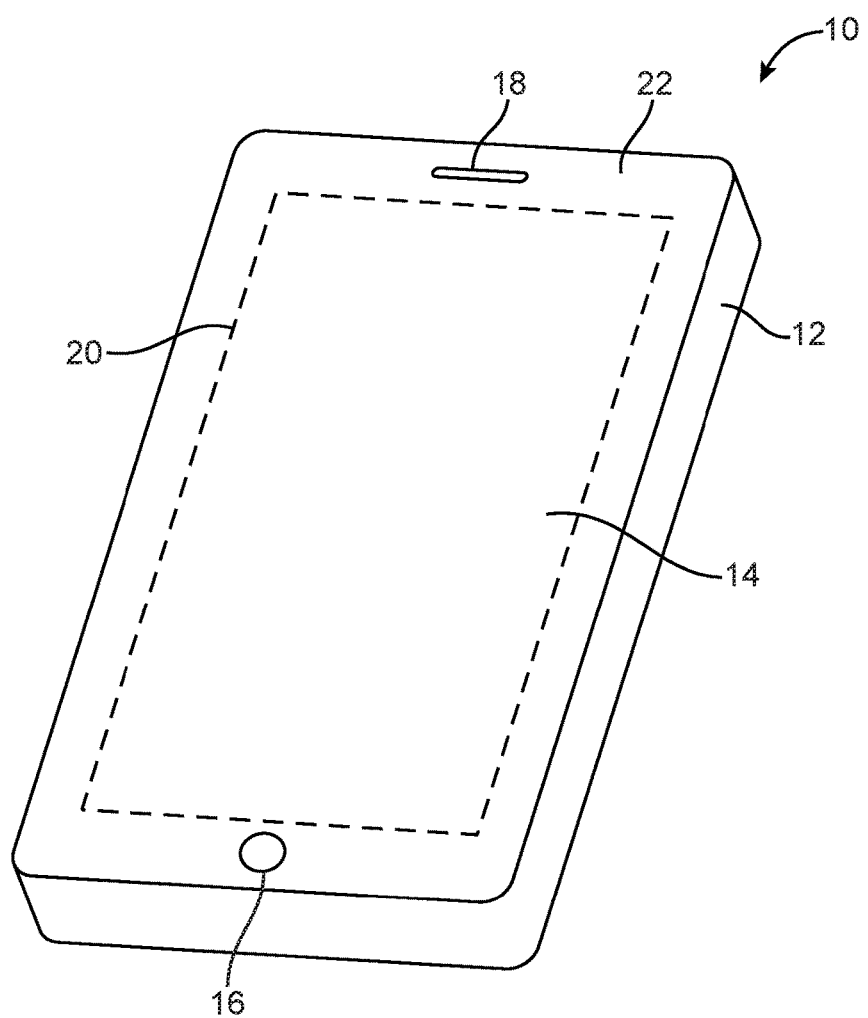
FIG. 1 is a perspective view of an illustrative electronic device such as a handheld electronic device with a display in accordance with an embodiment of the present invention.

An illustrative electronic device of the type that may be provided with a flexible substrate layer that is directly integrated into a display, a printed circuit board, or both the display and the printed circuit board, is shown in FIG. 1. Electronic device 10 may be a portable electronic device or other suitable electronic device. For example, electronic device 10 may be a laptop computer, a tablet computer, a somewhat smaller device such as a wrist-watch device, pendant device, or other wearable or miniature device, a cellular telephone, media player, electronic books, etc. The electronic device might be a larger device as well, such as a television or digital sign.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material. In other situations, housing 12 or at least some of the structures that make up housing 12 may be formed from metal elements.

Device 10 may include components such as buttons, input-output port connectors, ports for removable media, sensors, microphones, speakers, status indicators, and other device components. As shown in FIG. 1, for example, device 10 may include buttons such as menu button 16. Device 10 may also include a speaker port such as speaker port 18 (e.g., to serve as an ear speaker for device 10).

Device 10 may include one or more displays such as display 14. Display 14 may be rigid or flexible or may have a combination of rigid and flexible layers. For example, a flexible display may include a flexible display layer (e.g., a flexible organic light-emitting diode array and a thin-film transistor layer formed on a flexible substrate). For the purpose of this invention, organic light-emitting diode displays are intended to encompass all types of light-emitting displays that comprise thin organic film layers, including displays comprising organic small molecules, polymers, dendrimers, and quantum dots. The thin film layers within the organic light emitting display may comprise a cathode layer, an anode layer, one or more emissive layers, one or more hole transport layers, one or more electronic transport layers, capping layers, hole injection layers, electron injection layers, exciton blocking layers, and blends and composites of these materials. Other types of flexible display technologies may be used to form a flexible display (e.g., electronic ink displays, electronic paper displays, flexible liquid crystal displays, flexible electrochromic displays, flexible electrowetting displays, etc.).

As another example, a liquid crystal display (LCD) may include a layer of liquid crystal material sandwiched between a color filter layer and a thin-film transistor layer. In general, display 14 may be based on any suitable display technology (liquid crystals, light-emitting diodes, organic light-emitting diodes, plasma cells, electronic ink arrays, electronic paper displays, etc).

Display 14 may include touch-sensitive elements (i.e., display 14 may be a touch screen). The touch sensitive elements may include an acoustic touch sensor, a resistive touch sensor, a piezoelectric touch sensor, a capacitive touch sensor (e.g., a touch sensor based on an array of indium tin oxide capacitor electrodes), a photosensitive touch sensor, or a touch sensor based on other touch technologies.

Display 14 may include a rectangular center portion (as indicated by dashed line 20 in FIG. 1) that includes an array of display pixels and is sometimes referred to as the active portion of display 14. The peripheral outer portion of display 14 (i.e., rectangular peripheral ring 22 of FIG. 1) may include circuitry that does not emit light and may therefore be referred to as the inactive portion of display 14.

Display 14 may receive image data from a main logic board, other printed circuit board, or other circuitry in the electronic device. Display 14 may transmit signals (e.g., touch input from a user of device 10) to a main logic board, other printed circuit board or other circuitry. For example, display driver circuitry may be mounted on a display layer such as a thin-film transistor (TFT) layer. The display driver circuitry may receive image data from a printed circuit board or return touch input to a printed circuit board. Control lines such as gate lines may be used to distribute signals to the display from the display driver circuitry.

In a conventional electronic device, a signal cable formed from a flexible printed circuit is used to convey image data from a printed circuit board to the display driver circuitry. In a typical arrangement, a first end of the flexible printed circuit is electrically connected to the TFT layer in a display. A layer of anisotropic conductive film is often used to mount the first end of flexible printed circuit to the TFT layer. A second end of the flexible printed circuit is electrically connected to a printed circuit board (PCB) in the device. A board-to-board connector is often used to connect the second end of the flexible printed circuit to the PCB.

A flexible printed circuit does not emit light and is therefore typically mounted in the inactive portion of a display. This creates an undesirable amount of inactive display area around the border of a display.

Device 10 may be provided with a flexible substrate layer that includes conductive paths for conveying data signals from a printed circuit board to the display or from the display to the printed circuit board. The flexible substrate layer may have one or more portions that form a layer of the display. The flexible substrate layer may have one or more portions that form a layer of the printed circuit board. The flexible substrate layer may have some portions that form a layer of the display and other portions that form a layer of the printed circuit board. As an example, the flexible substrate layer may have opposing ends. One or both of the opposing ends may be directly integrated into the display and/or the printed circuit board.

A flexible substrate layer having some portions that form a layer of a display and/or some portions that form a layer of a printed circuit board may reduce inactive display area and may reduce or eliminate the need for connecting structures on the display and/or the printed circuit board that add undesirable bulk to an electronic device.

Figure 2:
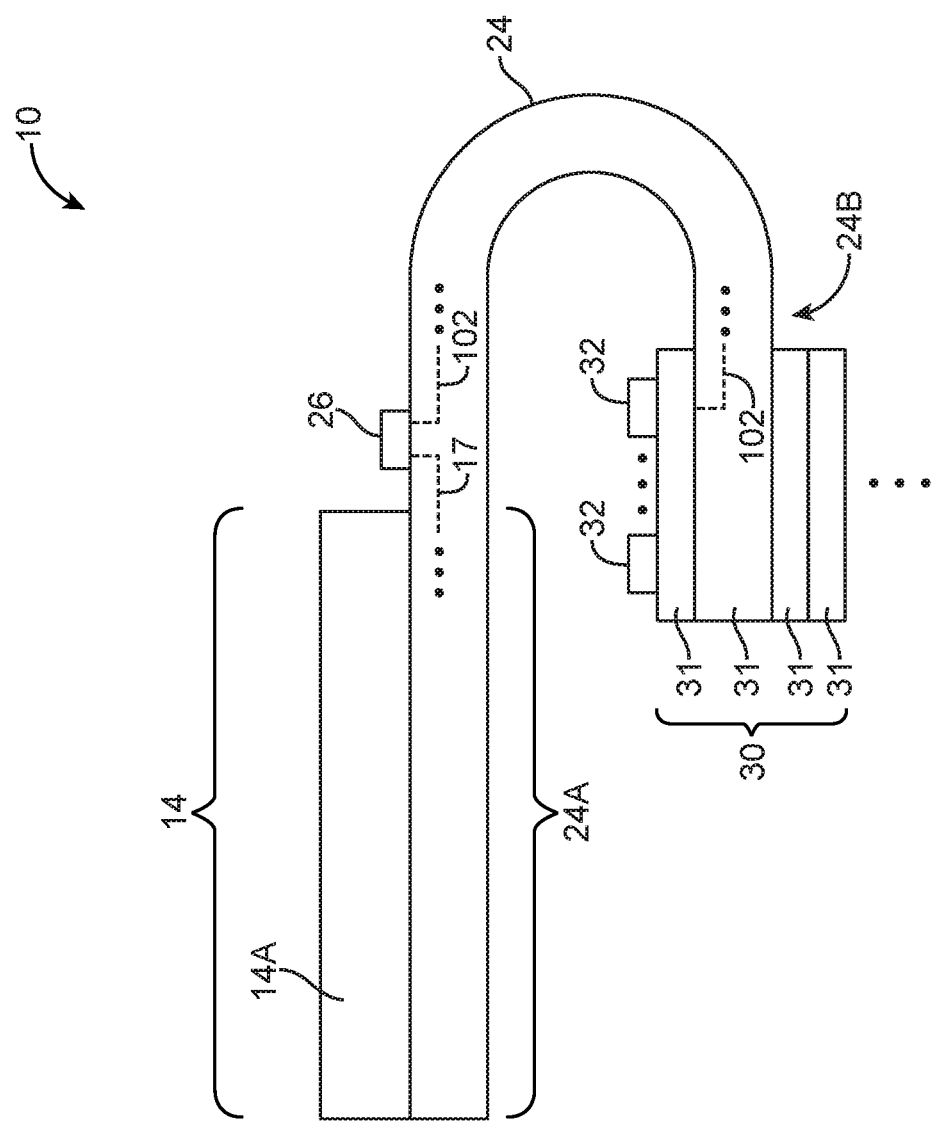
FIG. 2 is a cross-sectional side view of a portion of an illustrative electronic device having a shared flexible substrate layer that forms an integrated layer of a display and a printed circuit board in accordance with an embodiment of the present invention.

A cross-sectional side view of an illustrative arrangement in which a shared flexible substrate forms an integrated layer of both a display and a printed circuit board is shown in FIG. 2. As shown in FIG. 2, display 14 may have one or more display layers such as display layer 14A. Display layer 14A may contain an array of active display pixels and may therefore form the active portion of display 14. Display layer 14A may be formed from glass, ceramic, plastic, flexible sheets of material such as polymers (e.g., polyimide, polyethylene terephthalate, or other materials that are capable of being provided in thin flexible sheets), other suitable materials, or a combination of these materials.

Display layer 14A may include multiple layers such as a touch-sensitive layer (e.g., a sheet of polymer with an array of transparent capacitor electrodes for a capacitive touch sensor), optical layers such as polarizing layers, shielding layers (e.g., for preventing electric fields from disrupting the operation of the display), heat sinking layers (e.g., for conducting heat away from the display), sealing layers (e.g., layers of sealant formed from thin films, polymers, inorganic materials, metal foils, composites, etc.), cover layers (e.g., a layer of cover glass), other suitable display layers, or a combination of these display layers.

Portions of a flexible substrate such as flexible substrate 24 may form a layer of display 14. For example, portion 24A of flexible substrate 24 may form a display substrate for display 14. If desired, circuitry for operating display 14 may be mounted on portion 24A of flexible substrate 24. For example, an array of thin-film transistors may be formed on the surface of flexible substrate 24 in region 24A and may be used to control emission of light from display 14. Transistors that may be formed on portion 24A of substrate 24 include polycrystalline silicon transistors, amorphous silicon transistors, organic thin-film transistors, metal oxide transistors, carbon nanotube or graphene transistors, other nanoparticle-based transistors, etc.

The transistors of the array may be controlled by control signals from driver circuitry such as display driver circuitry 26 (e.g., a driver integrated circuit). Display driver circuitry 26 may, if desired, be mounted on flexible substrate layer 24 and may be used to supply control signals to the array of transistors. This is, however, merely illustrative. If desired, driver circuitry 26 may be formed as an integral portion of flexible substrate 24. If desired, circuitry such as thin-film transistors and display driver integrated circuits may be formed entirely within flexible substrate 24, between flexible substrate 24 and display layer 14A, partially within display layer 14A, entirely within display layer 14A or partially within both display layer 14A and flexible substrate 24.

Portion 24B of flexible substrate 24 may form an integrated layer of printed circuit 30. Printed circuit 30 and other printed circuits in device 10 may contain a stack of multiple layers such as layers 31. For example, a printed circuit may contain a combination of both rigid and flexible layers (sometimes referred to as a "rigid-flex" PCB). A multi-layer printed circuit such as printed circuit 30 may sometimes be referred to as a PCB stack or PCB stack-up. Layers 31 of PCB 30 may be formed from dielectrics such as fiberglass-filled epoxy (e.g., as a rigid layer in a PCB stack) and polyimide (e.g., as a flexible layer in a PCB stack), FR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (woven glass and epoxy), CEM-4 (woven glass and epoxy), CEM-5 (woven glass and polyester), paper impregnated with phenolic resin, polystyrene, polyimide, polytetrafluoroethylene (PTFE), plastic, other polymers, ceramics, or other suitable dielectrics.

Layers 31 may include attachment layers such as layers of prepreg (i.e., pre-impregnated layers of fiber and resin). Layers of copper or other conductive materials may be formed on the surfaces of layers 31. For example, one or more of layers 31 may have upper and lower surfaces that are covered with a layer of metal such as copper.

Integrated circuits, discrete components such as resistors, capacitors, and inductors, and other electronic components 32 may be mounted to PCB 30. Display driver circuitry 26 may receive image data from processing circuitry in PCB 30 (e.g., from integrated circuits such as components 32) and produce corresponding control signals for display 14. Flexible substrate 24 may be used to route signals to display driver integrated circuit 26 from components 32 or other circuitry in PCB 30. Flexible substrate 24 may contain patterned conductive traces 102 (e.g., conductive traces on flexible sheets of substrate such as polyimide sheets). Patterned conductive traces 102 may form signal lines that convey signals from PCB 30 (e.g., from integrated circuits such as components 32) to display circuitry such as display driver circuitry 26. Driver circuitry 26 may distribute signals to the display pixels via traces such as traces 17.

In the example of FIG. 2, portion 24A of flexible substrate 24 may form an integrated layer of display 14. Portion 24B of flexible substrate 24 may form an integrated layer of PCB 30 (e.g., substrate 24 may form one of the layer 31 in PCB stack 30). In configurations in which flexible substrate 24 forms a portion of both display 14 and PCB 30, the need for a connecting structure such as a board-to-board connector to attach flexible substrate 24 to PCB 30 and the need for surface area for mounting a separate structure to the display may be reduced or eliminated. Inactive borders around a display may therefore by reduced or eliminated. This arrangement may also simplify the interconnects between display 14 and PCB 30 and thus reduce power consumption and increase efficiency of the display.

Figure 3:
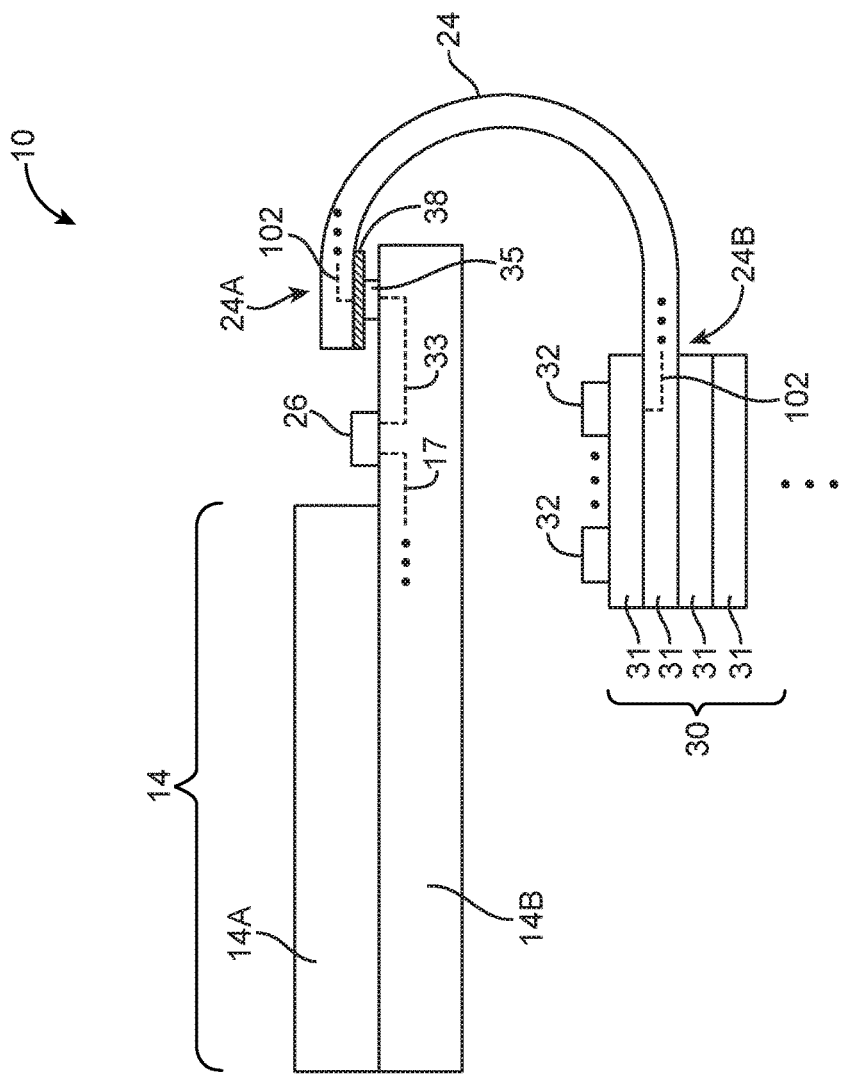
FIG. 3 is a cross-sectional side view of a portion of an illustrative electronic device having a flexible substrate layer that forms an integrated layer of a printed circuit board in accordance with an embodiment of the present invention.

If desired, portion 24A of flexible substrate 24 may be electrically coupled to display 14 using a conductive material and the portion 24B may form an integrated layer of PCB 30, as shown in FIG. 3.

In the example of FIG. 3, display 14 may contain multiple layers such as display layer 14A and display layer 14B. Display layer 14B may contain circuitry for operating display 14. For example, an array of thin-film transistors (TFTs) may be formed on the surface of display layer 14B and may be used to control the emission of light from display 14. Transistors in layer 14B may include polycrystalline silicon transistors, amorphous silicon transistors, organic thin-film transistors, metal oxide transistors, carbon nanotube or graphene transistors, other nanoparticle-based transistors, etc. The transistors of the array may be controlled by control signals from driver circuitry 26 (e.g., a driver integrated circuit). If desired, driver circuitry 26 may be mounted on layer 14B.

Display layers 14A and 14B may be formed from glass, ceramic, plastic, flexible sheets of material such as polymers (e.g., polyimide, polyethylene terephthalate, or other materials that are capable of being provided in thin flexible sheets), other suitable materials, or a combination of these materials.

Flexible substrate 24 may be used to convey data signals between display 14 and PCB 30. Portion 24B of flexible substrate 24 may form an integrated layer of printed circuit 30. Data signals from circuitry in PCB 30 (e.g., data signals from processing circuitry or other components such as components 32) may be routed to display layer 14B via patterned traces 102 (sometimes referred to as signal lines) on flexible substrate 24.

Portion 24A of flexible substrate 24 may be electrically coupled to display layer 14B. In the example of FIG. 3, conductive adhesive 38 and solder pad 35 electrically couple conductive traces 102 on flexible substrate 24 with conductive traces on display layer 14B such as conductive trace 33. Traces 33 may interconnect signal lines 102 from flexible substrate 24 to display driver circuitry 26. Display driver circuitry 26 may distribute signals to display 14 via conductive traces 17.

Figure 4:
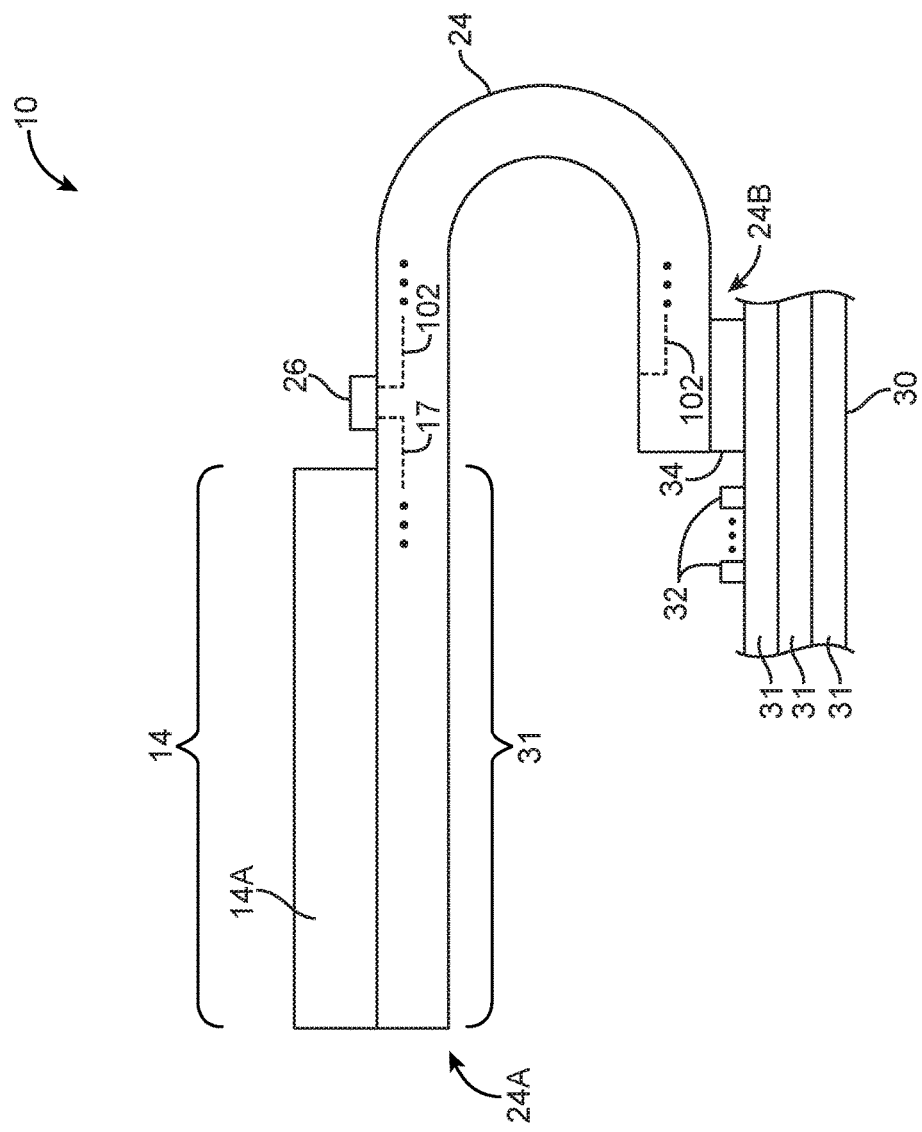
FIG. 4 is a cross-sectional side view of a portion of an illustrative electronic device having a flexible substrate layer that forms an integrated layer of a display in accordance with an embodiment of the present invention.

If desired, portion 24B of flexible substrate 24 may be attached to PCB 30 using a connecting structure and the portion 24A may form an integrated layer of display 14, as shown in FIG. 4.

In the example of FIG. 4, portion 24B of flexible substrate layer 24 is connected to PCB 30 using a connecting structure such as connecting structure 34 (e.g., a board-to-board connector, zero insertion force connector, etc.).

Portion 24A of flexible substrate 24 may form an integrated layer of display 14. For example, portion 24A of flexible substrate 24 may form a display substrate for the display. If desired, circuitry for operating display 14 may be mounted on portion 24A of flexible substrate 24. For example, an array of thin-film transistors may be formed on the surface of flexible substrate 24 in region 24A and may be used to control emission of light from display 14. Transistors that may be mounted on portion 24A of substrate 24 include polycrystalline silicon transistors, amorphous silicon transistors, organic thin-film transistors, etc.

Display driver circuitry 26 may, if desired, be mounted on flexible substrate layer 24 and may be used to supply control signals to the array of transistors. This is, however, merely illustrative. If desired, driver circuitry 26 may be formed as an integral portion of flexible substrate 24. If desired, circuitry such as thin-film transistors and display driver integrated circuits may be formed entirely within flexible substrate 24, between flexible substrate 24 and display layer 14A, partially within display layer 14A, entirely within display layer 14A or partially within both display layer 14A and flexible substrate 24.

As described above in connection with FIGS. 2 and 3, patterned traces 102 on flexible substrate layer 24 may be used to form signal lines that convey data signals between circuitry on PCB 30 and display circuitry such as display driver circuitry 26. Because flexible substrate layer 24 forms an integrated layer of display 14, no surface area is required for mounting a separate structure to the display. This may reduce the amount of inactive display area around the border of a display and allow signals to be conveyed directly from traces on flexible substrate 24 to display driver circuitry 26. Simplifying the interconnects between display 14 and PCB 30 in this way may help reduce power consumption, increase efficiency, and improve reliability of the display.

Figure 5:
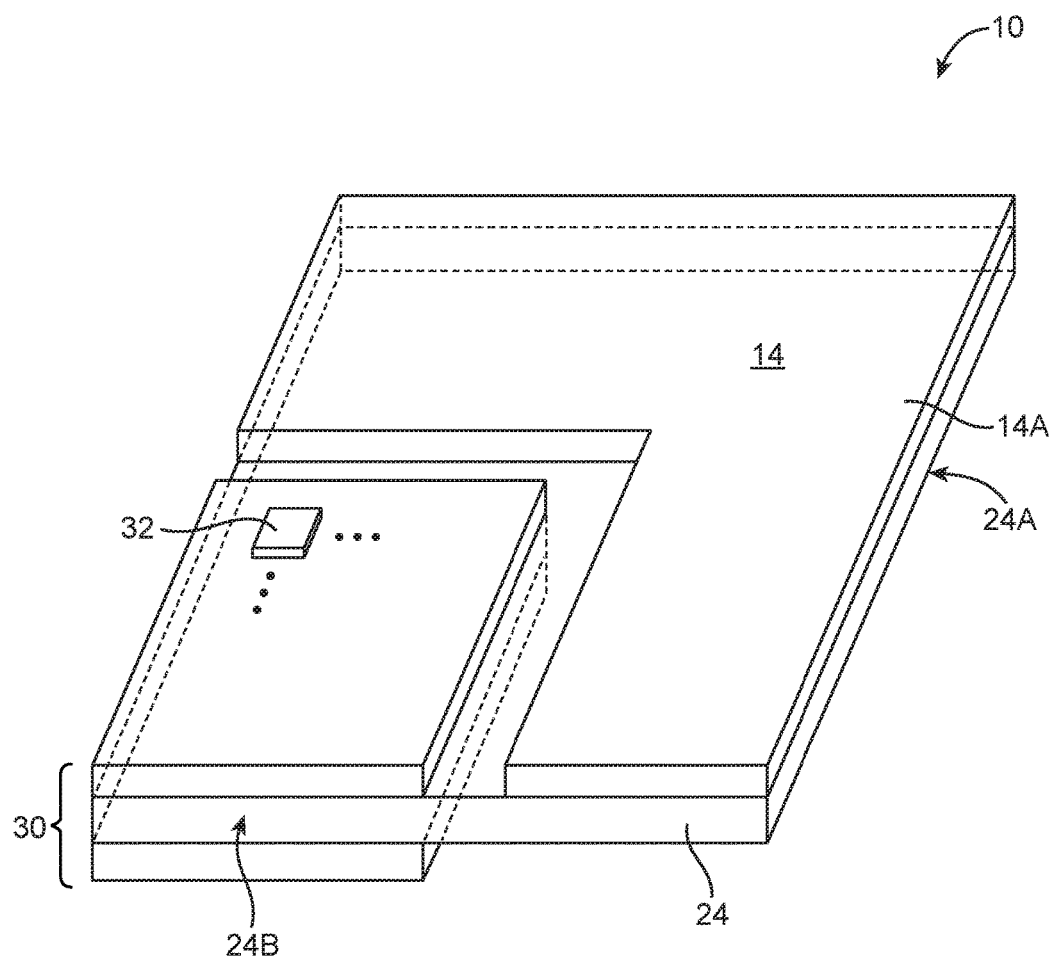
FIG. 5 is a perspective view of a portion of an illustrative electronic device having a shared flexible substrate layer that forms an integrated layer of a display and a printed circuit board in accordance with an embodiment of the present invention.

Flexible substrate layer 24 may have some portions that form a layer of display 14 and some portions that form a layer of PCB 30 that protrudes from multiple edges (sides) of PCB 30 as shown in FIG. 5. In the example of FIG. 5, flexible substrate layer 24 protrudes from two edges (sides) of PCB 30. This is merely illustrative. Flexible substrate layer 24 may protrude from one side, from two sides, from three sides, or from all four sides of PCB 30.

Figure 6:
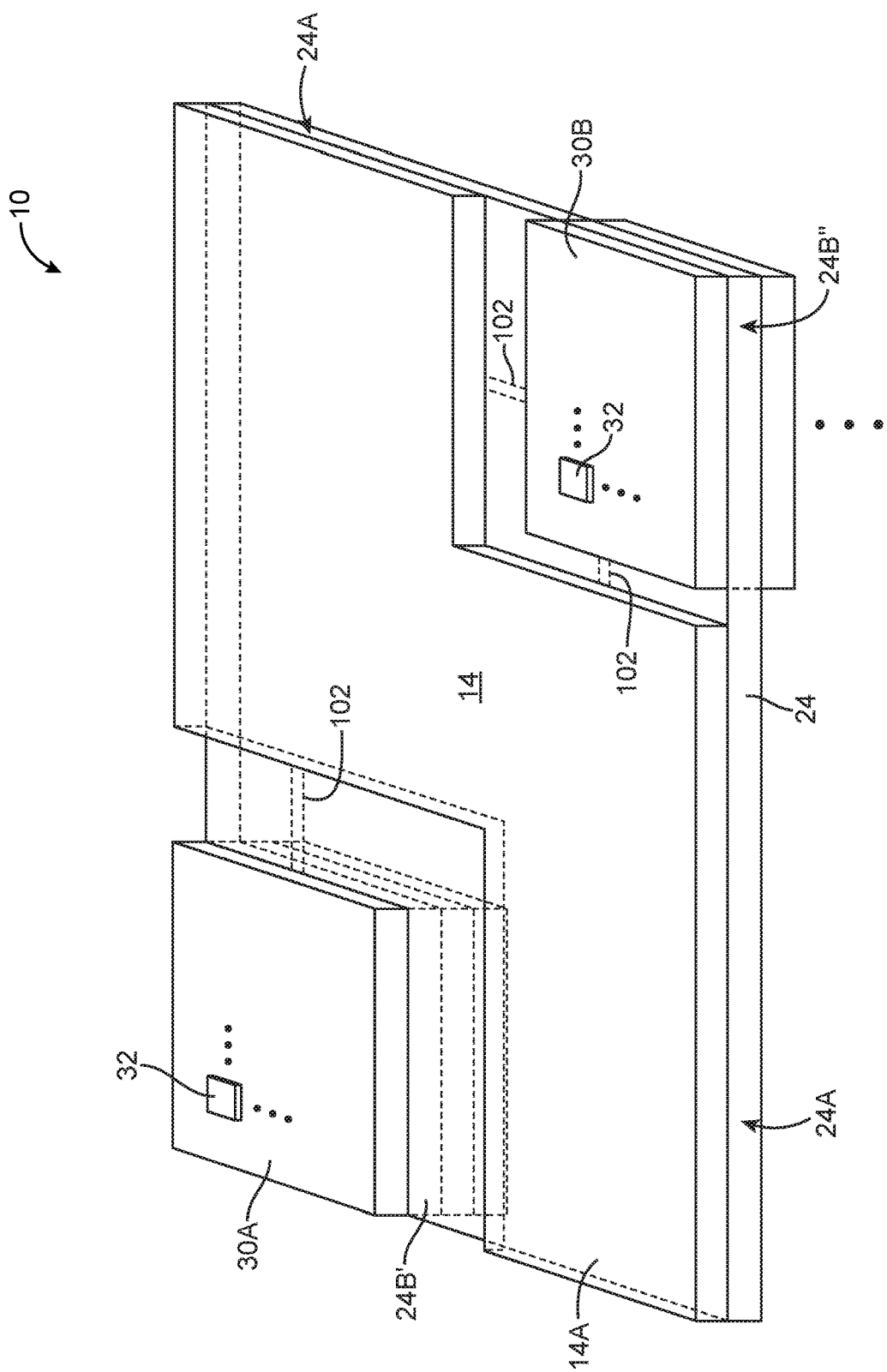
FIG. 6 is a perspective view of a portion of an illustrative electronic device having a shared flexible substrate layer that forms an integrated layer of a display and a plurality of printed circuit boards in accordance with an embodiment of the present invention.

If desired, a flexible substrate layer such as flexible substrate layer 24 may form a layer of one or more PCB stacks and/or one or more displays as shown in FIG. 6. In the example of FIG. 6, flexible substrate layer 24 is integrated into a plurality of PBC stacks such as PCB stack 30A and PCB stack 30B. Some portions 24B' of flexible substrate layer 24 may form a layer of PCB stack 30A while other portions 24B" may form a layer of PCB stack 30B. Portion 24A of flexible substrate layer 24 that is integrated into display 14 may contain circuitry such as circuitry for operating display 14. Signals may be routed between PCB 30A, PCB 30B, and display 14 via conductive traces 102 in flexible substrate layer 24.

As shown in FIGS. 2, 5, and 6, a single flexible substrate such as flexible substrate 24 may have at least one portion that forms a layer in a multi-layer PCB and at least one portion that forms a layer in a display. Other configurations in which a shared flexible substrate layer is directly integrated into both a display and a PCB may be used. The examples shown in FIGS. 2, 5, and 6 are merely illustrative. If desired, flexible substrate 24 may be formed as an integral portion of a PCB stack-up. If desired, one or more PCB stack-ups may be prefabricated and mounted on opposing sides of flexible substrate 24 as shown in FIG. 6.

Figure 7:
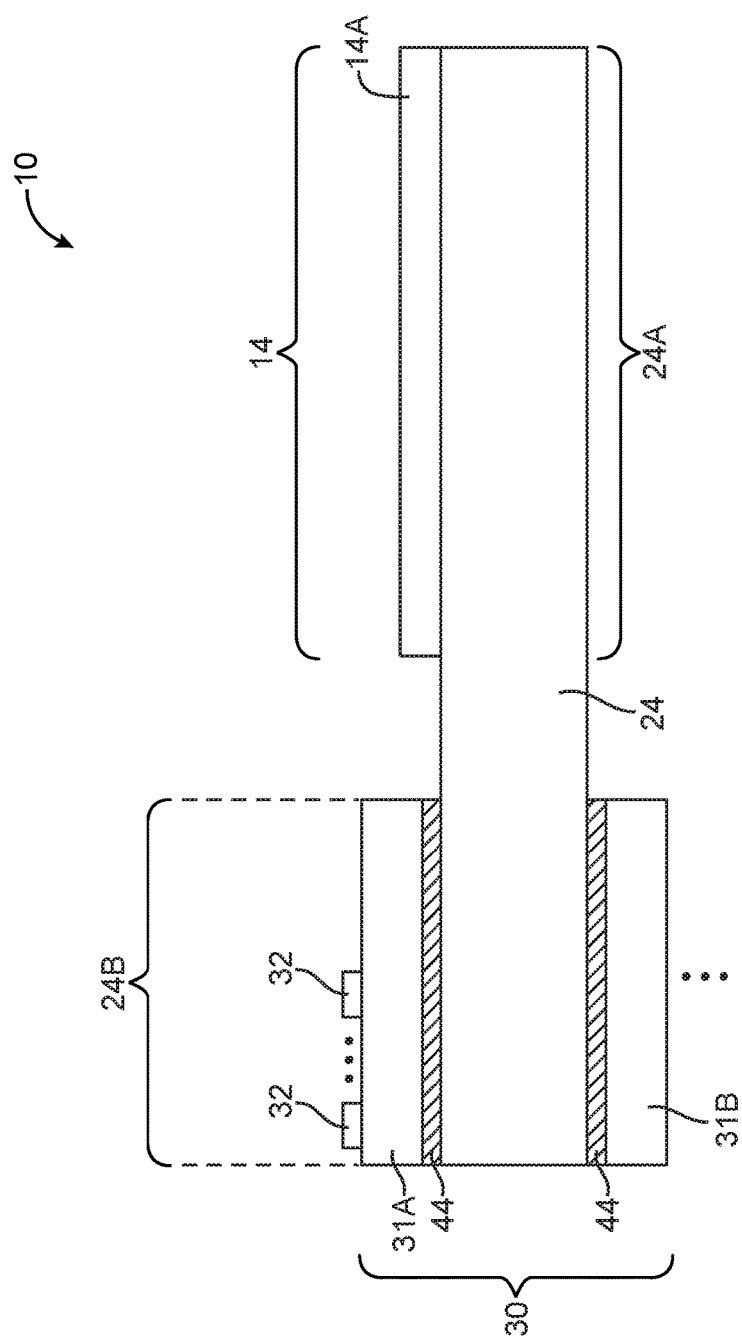
FIG. 7 is a cross-sectional view of a portion of an illustrative electronic device having a shared flexible substrate layer that is bonded to layers in a printed circuit board using a conductive material in accordance with an embodiment of the present invention.

FIG. 7 is a side view of an illustrative configuration that may be used to attach portion 24B of flexible substrate layer 24 to PCB stack 30. A layer of conductive material such as conductive adhesive 44 may be interposed between flexible substrate layer 24 and adjacent layers 31A and 31B of PCB 30. Conductive adhesive 44 may be formed from anisotropic conductive film (ACF) or other suitable conductive adhesives that will form an electrical bond between contacts or conductive traces in PCB 30 and contacts or conductive traces in flexible substrate layer 24. Adhesives, conductive foam, conductive springs, welds (e.g., laser welds), solder joints, or other types of bonds may be used in connecting the conductive and/or dielectric materials in flexible substrate layer 24 and PCB 30. The use of conductive adhesive as shown in FIG. 7 is merely illustrative.

Figure 8:
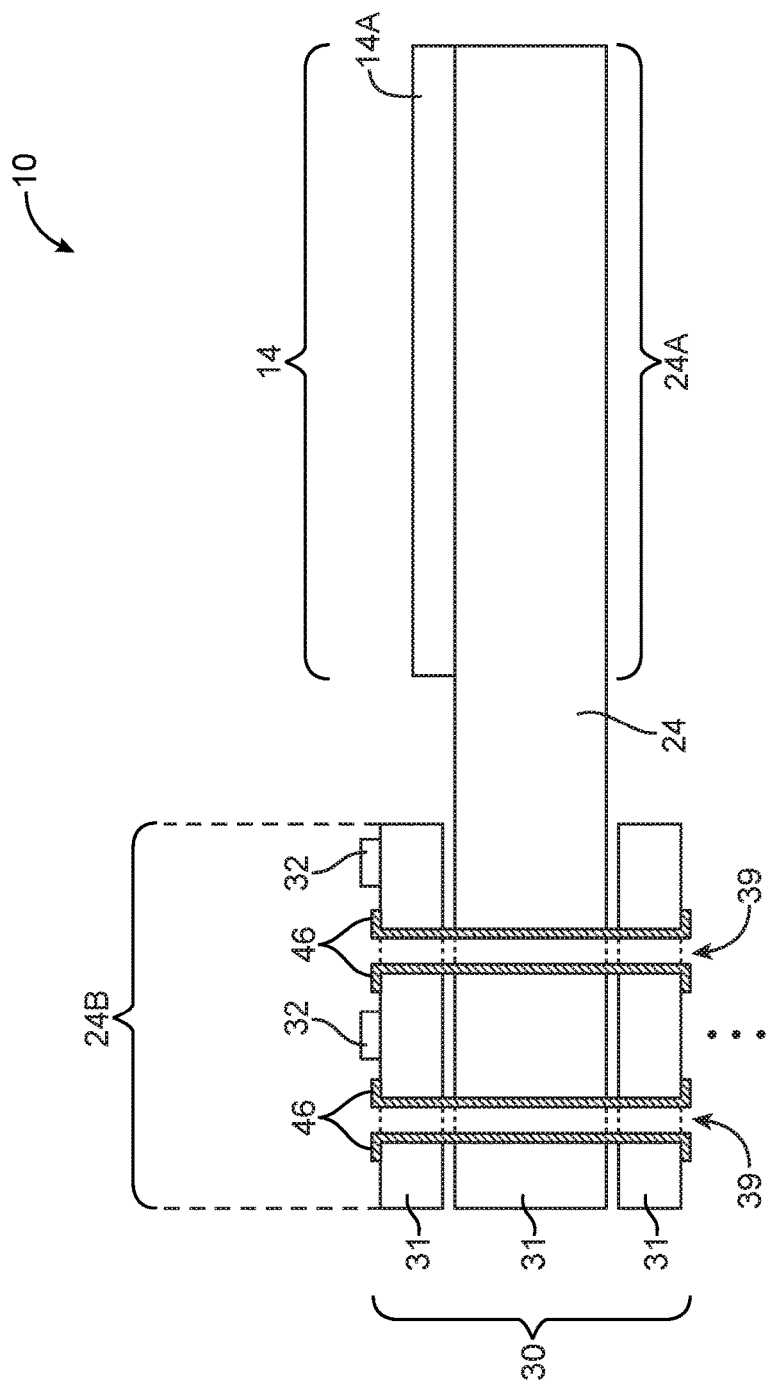
FIG. 8 is a cross-sectional view of a portion of an illustrative electronic device having a shared flexible substrate layer and a printed circuit board with vias that interconnect components and printed circuit board layers in accordance with an embodiment of the present invention.

If desired, layers 31 of PCB 30 may be electrically connected to other layers 31 through flexible substrate 24 as shown in FIG. 8. As shown in FIG. 8, vertical conductive structures such as conductive vias 46 may be used to electrically connect interconnects in different layers of PCB 30. As shown in FIG. 8, vias 46 may be plated or hollowed vias that line vertical openings 39 in the PCB stack. If desired, other types of vias may be used (e.g., vias may be filled or partially filled with conductive material).

Vias such as vias 46 may be contained entirely within the interior of PCB 30 (sometimes referred to as buried vias), may connect an exterior surface of PCB 30 to an interior surface of PCB 30 (sometimes referred to as blind vias), or may pass through the entire thickness of PCB 30 (sometimes referred to as through vias). Vias 46 may be formed using laser drilling, mechanical drilling (i.e., with a drill bit) or other mechanical machining techniques. Openings 39 may be filled or coated using metal (e.g., copper) plating techniques, by filling openings 39 with conductive paste, by filling openings 39 with conductive adhesive, or by filling openings 39 with other conductive material. Materials that may be used in forming vias 46 include copper, silver, gold, copper-tungsten, other suitable metals, carbon-based or organic conductors, or a combination of these materials. Other methods or structures may be used to electrically connect different layers of PCB stack 30 that includes shared flexible substrate layer 24. The use of conductive vias 46 as shown in FIG. 8 is merely illustrative.

Figure 9:
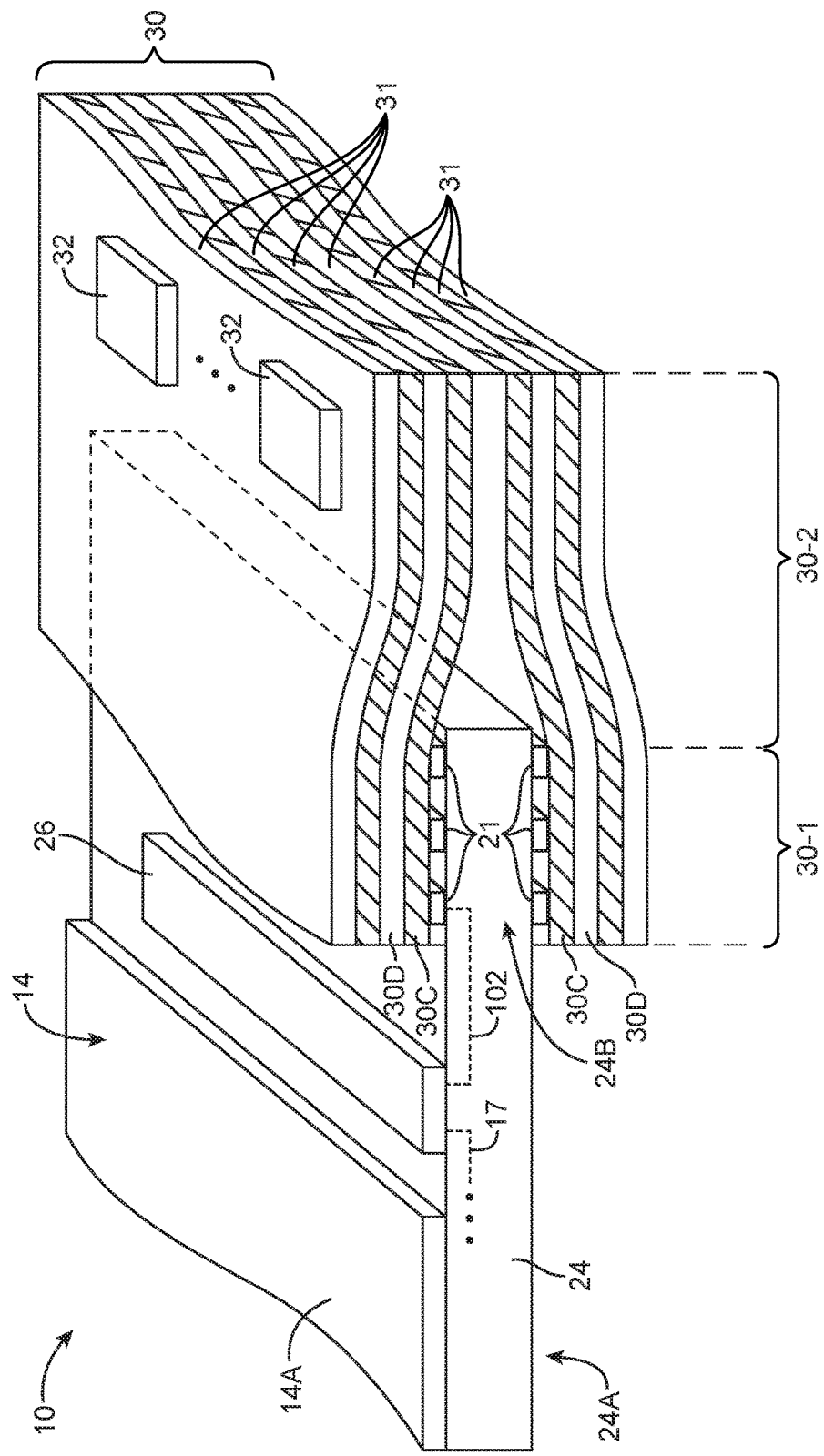
FIG. 9 is a cross-sectional perspective view of a portion of an illustrative electronic device having a shared flexible substrate layer that forms an integrated layer of a display and is partially inserted into a printed circuit board in accordance with an embodiment of the present invention.

If desired, the flexible substrate layer may form a partial layer of a PCB stack as shown in FIG. 9. For example, flexible substrate layer 24 may only be partially inserted into the stack of PCB layers. In the example of FIG. 9, a portion such as portion 30-1 of PCB stack 30 includes layers 31 on opposing sides of a portion of flexible substrate layer 24. Flexible substrate 24 may therefore be integrated as a layer of portion 30-1 of PCB stack 30. Flexible substrate layer 24 may not be included in a portion of the PCB such as portion 30-2 of PCB 30.

Layers 31 of PCB stack 30 may have conductive layers such as conductive PCB layers 30C and dielectric layers such as dielectric PCB layers 30D. Conductive layers 30C may be patterned metal layers for forming interconnects. Dielectric layers 30D may be alternating layers of prepreg and core material (e.g., FR-4) or other suitable dielectric layers. Electrical contacts such as contacts 21 may be used to connect traces 102 on flexible substrate layer 24 with traces in PCB stack 30. Electrical contacts in PCB 30 such as contacts 21 may be contact pads, solder pads, or interconnect structures, or may be formed from patterned conductive layers in PCB 30 (e.g. layers such as PCB layers 30C), or other suitable conductive structures. Contacts 21 may, for example, be formed from copper or copper plated with gold or other materials. Contacts 21 may be electrically connected to the interconnects of PCB 30 (e.g., using vias such as vertical vias 46 of FIG. 8, using parts of horizontal interconnects in layers 30C, etc.).

Figure 10:
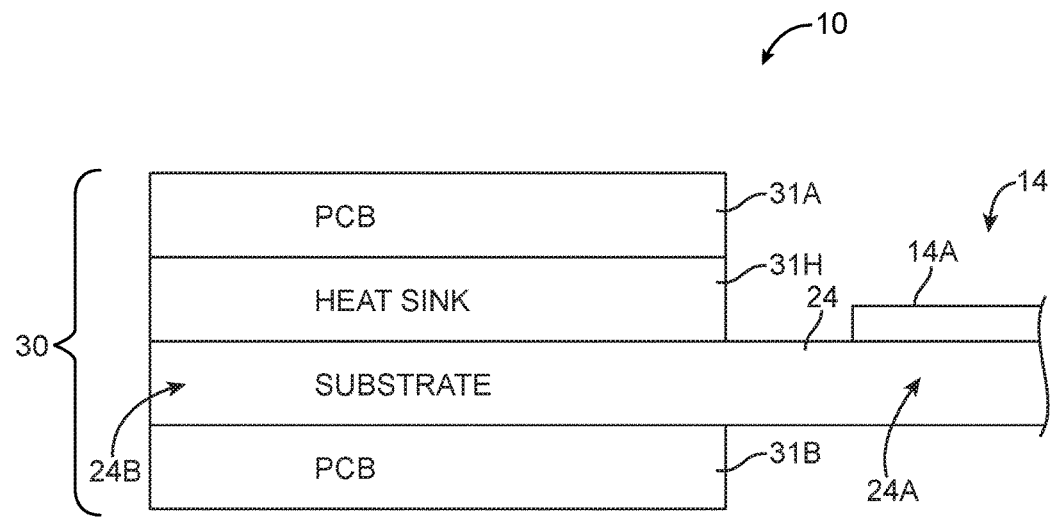
FIG. 10 is a cross-sectional side view of a portion of an illustrative electronic device having a printed circuit board with heat sink layers in accordance with an embodiment of the present invention.

Components such as components 32 may be mounted on PCB 30. Components 32 or other circuitry associated with PCB 30 may generate heat that may damage components 32 or PCB 30. PCB 30 may be provided with heat sink structures such as heat sink layer 31H of FIG. 10. As shown in FIG. 10 PCB stack 30 may include a heat sink structure such as heat sink layer 31H that is formed over shared substrate layer 24. Heat sink layer 31H may help dissipate heat that is generated by components in PCB stack 30. Heat sink layer 31H may also help conduct heat away from display 14.

Figure 11:
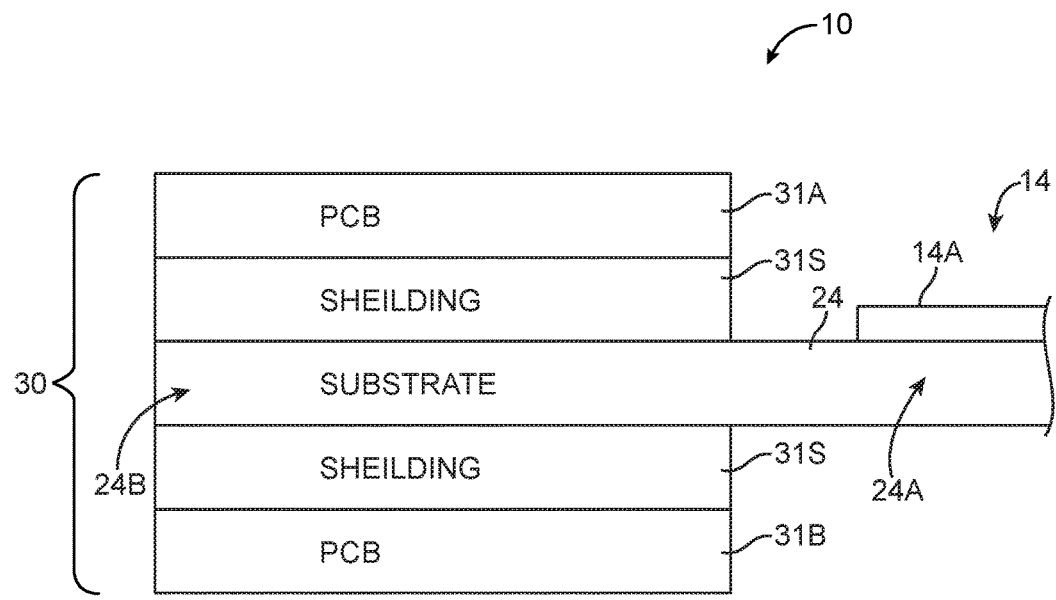
FIG. 11 is a cross-sectional side view of a portion of an illustrative electronic device having a printed circuit board with shielding layers in accordance with an embodiment of the present invention.

If desired, PCB 30 may be provided with one or more shielding layers as shown in FIG. 11. High frequency signals may be communicated between display 14 and PCB 30 during operation of display 14. Shielding layers such as shielding layers 31S may help block emission from these high frequency signals that may cause electromagnetic interference (EMI) with circuitry in PCB 30 or other components of device 10. Shielding layers 31S may also reduce the amount of unwanted electromagnetic energy radiated by device 10. Shielding layers 31S may shield separate circuits in PCB 30 from interfering with each other. Shielding layers 31S may be interposed between substrate layer 24 and adjacent PCB layers 31A and 31B. This is merely illustrative. PCB 30 may be provided with one shielding layer, two shielding layers, three shielding layers, or more than three shielding layers. Shielding layers such as shielding layers 31S may be formed on one side of substrate 24 or on opposing sides of substrate 24. If desired, PCB 30 may be provided without any shielding layers.

Figure 12:
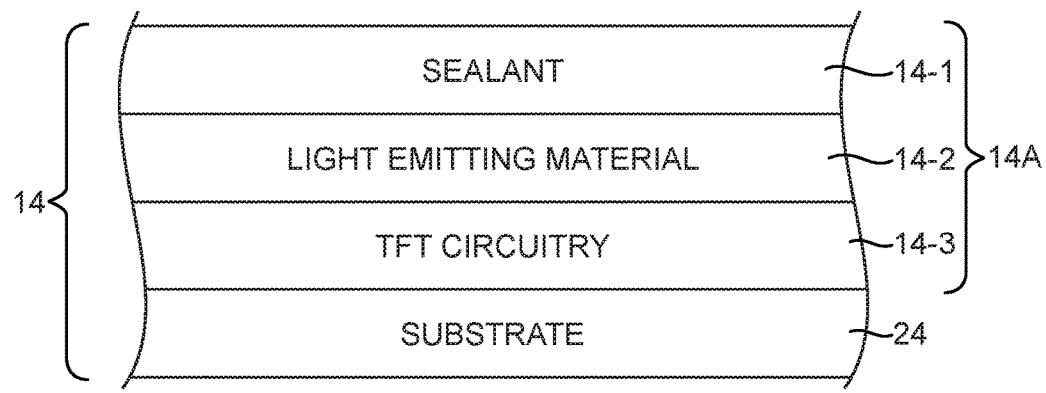
FIG. 12 is a cross-sectional side view of a portion of an illustrative organic light-emitting diode display having a shared flexible substrate layer in accordance with an embodiment of the present invention.

If desired, display 14 may be a flexible display that uses flexible display technology such as an organic-light emitting diode (OLED) pixel array formed on a flexible substrate. As shown in FIG. 12, display layer 14A may include multiple layers formed on flexible substrate layer 24. Display layer 14A may include a circuitry layer such as thin-film transistor (TFT) circuitry layer 14-3 that includes an array of thin-film transistors. Layer 14-3 may be formed on shared substrate layer 24, may be formed as a separate circuitry layer, or may have portions formed in substrate layer 24 and portions formed in display layer 14A. TFT circuitry layer 14-3 may contain circuitry such as display driver integrated circuits, gate line drivers formed from low-temperature polysilicon transistors, transistors formed from amorphous silicon, metal oxide transistors, carbon nanotube or graphene transistors, other nanoparticle-based transistors, etc. Circuitry and electronic components in TFT circuitry layer 14-3 may be mounted on flexible substrate layer 24.

Display layer 14A may include a layer of light-emitting material such as light-emitting layer 14-2. Light-emitting layer 14-2 may be formed over TFT circuitry layer 14-3. Light-emitting layer 14-2 may be formed from an array of organic-light emitting diodes (OLEDs) or other light-emitting material, such as quantum dots. If desired, OLED material 14-2 may be formed from a thin film that is deposited or integrated into TFT layer 14-1.

Figure 13:
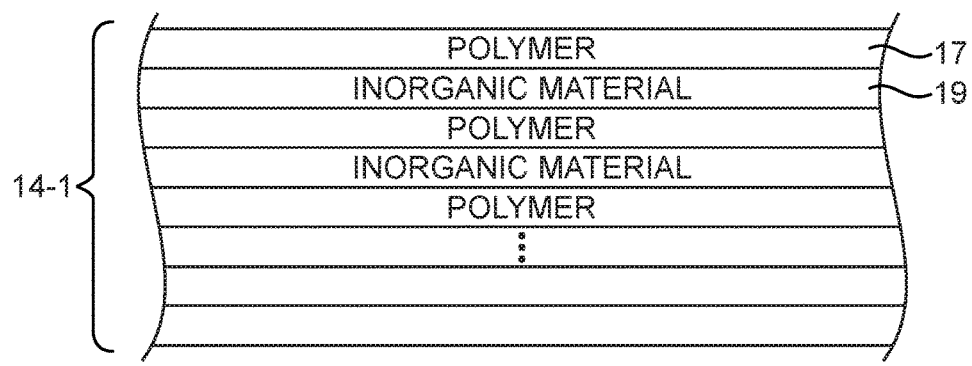
FIG. 13 is a cross-sectional side view of a portion of an illustrative organic light-emitting diode display in accordance with an embodiment of the present invention.

OLED layer 14-2 may be covered with a sealant such as sealant layer 14-1. Sealant 14-1 may be formed from polymers (e.g., a layer of polymer that is deposited over OLED layer 14-2), metal foil (e.g., a layer of metal foil that is laminated, sputtered, evaporated, or otherwise applied onto OLED layer 14-2), or other suitable coating or conformal covering. If desired, sealant 14-1 may be formed from multiple layers. As shown in FIG. 13, sealant 14-1 may be formed from alternating layers of polymer 17 and inorganic material 19.

Figure 14:
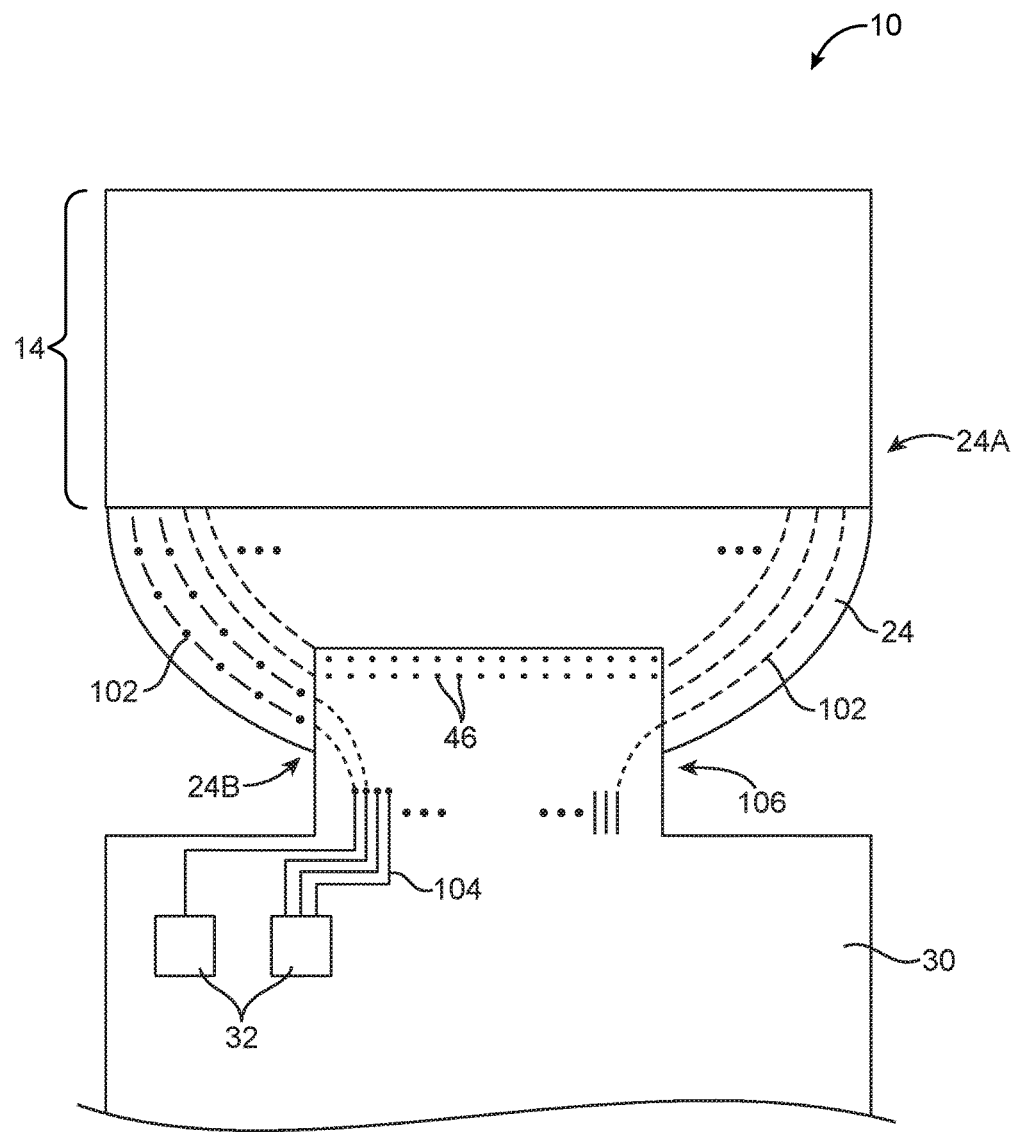
FIG. 14 is a top view of a portion of an illustrative electronic device having a shared flexible substrate layer that is directly integrated into a display and a main logic board in accordance with an embodiment of the present invention.

A shared flexible substrate layer that forms a layer of a display and a multi-layer PCB may also help directly connect a high density of conductive traces in a PCB such as a main logic board to a low density of conductive traces in a flexible substrate as shown in FIG. 14.

In the example of FIG. 14, main logic board 30 includes components such as components 32. Components 32 may include integrated circuits such as a microprocessor, a microcontroller, an audio chip, an application-specific integrated circuit, or other integrated circuit. If desired, discrete electrical components (e.g., resistors, inductors, capacitors, and transistors) may be mounted in internal cavities in printed circuit board 30 or multiple integrated circuits may be mounted in internal cavities in printed circuit board 30. If desired, different types of stand-alone components may also be embedded in printed circuit board 30, such as antennas, sensors, power sources such as batteries and supercapacitors, etc. The example of FIG. 14 is merely illustrative.

Some portions of flexible substrate layer 24 may form a layer in main logic board 30. Other portions of flexible substrate layer 24 may form a layer in display 14. Substrate 24 may contain patterned conductive traces such as traces 102 that convey data signals from components 32 on board 30 to display circuitry in display 14 (e.g., a driver integrated circuit).

Traces on board 30 such as conductive traces 104 may be used to distribute data signals to signal lines 102 in substrate layer 24. Signals may travel from components 32 on the outermost layers of board 30 to substrate layer 24 using vertical conductive structures such as conductive vias 46. Conductive traces 104 in board 30 may have a relatively high pitch (e.g., a high density of conductive traces) compared to signal lines 102 in substrate layer 24, which may have a relatively low pitch. Signal lines 102 may be form a pattern that fans high pitch traces 104 out from region 106 to low pitch traces 102 of substrate 24.

Because shared substrate layer 24 forms an integrated layer in display 14, signals from traces 102 may be routed directly to display circuitry without requiring any mounting surface area on display 14. Because shared substrate layer 24 forms an integrated layer in board 30, the need for a connecting structure such as a board-to-board connector may be eliminated. By simplifying interconnects between board 30 and display 14, device 10 may be more efficient, may consume less power, may be more reliable, and may enable desirable design features.

The foregoing is merely illustrative of the principles of this invention and various modifications can be made by those skilled in the art without departing from the scope and spirit of the invention.

What is claimed is:

1. An electronic device, comprising:
   a display;
   a multi-layer printed circuit; and
   a flexible substrate having a first portion that forms a layer in the display and a second portion that forms a layer in the multi-layer printed circuit, wherein the flexible substrate has a curved portion between the first and second portions.

2. The electronic device defined in claim 1 wherein the multi-layer printed circuit includes a conductive via that forms an electrical connection between a layer in the multi-layer printed circuit and a trace on the second portion of the flexible substrate.

3. The electronic device defined in claim 2 further comprising an integrated circuit mounted to the multi-layer printed circuit.

4. The electronic device defined in claim 2 wherein the flexible substrate includes signal lines that convey signals from the multi-layer printed circuit to the display.

5. The electronic device defined in claim 1 wherein the display comprises an array of thin-film transistors formed on the first portion of the flexible substrate and wherein the array of thin-film transistors is configured to control emission of light from the display.

6. The electronic device defined in claim 5 wherein the display further comprises a layer of organic light-emitting diodes formed over the array of thin-film transistors.

7. The electronic device defined in claim 1 wherein the flexible substrate comprises at least one sheet of polymer.

8. The electronic device defined in claim 1 further comprising a layer of conductive adhesive interposed between the second portion of the flexible substrate and an adjacent layer of the multi-layer printed circuit.

9. An electronic device, comprising:
   a display substrate;
   an array of pixels formed on a first region of the display substrate; and
   a multi-layer printed circuit located at least partially behind the array of pixels, wherein the display substrate has a second region that forms a layer in the multi-layer printed circuit.

10. The electronic device defined in claim 9 wherein the display substrate has a bent region between the first and second regions.

11. The electronic device defined in claim 9 further comprising an electronic component mounted on the second region of the display substrate.

12. The electronic device defined in claim 11 further comprising conductive signal lines that convey signals between the array of pixels and the electronic component.

13. The electronic device defined in claim 9 further comprising a conductive via in the multi-layer printed circuit that passes through the second region of the display substrate.

14. The electronic device defined in claim 9 wherein the multi-layer printed circuit comprises a rigid printed circuit board.

15. The electronic device defined in claim 9 wherein the multi-layer printed circuit comprises a flexible printed circuit.

16. An electronic device, comprising:
    a display having an array of pixels;
    a printed circuit that is located at least partially behind the array of pixels; and
    a flexible substrate having a first portion on which the array of pixels are formed, a second portion that is sandwiched between layers of the printed circuit, and a curved portion between the first and second portions.

17. The electronic device defined in claim 16 wherein the display comprises an array of thin-film transistors formed on the first portion of the flexible substrate.

18. The electronic device defined in claim 17 wherein the display further comprises a layer of organic light-emitting diodes formed over the array of thin-film transistors.

19. The electronic device defined in claim 16 further comprising an integrated circuit mounted to the printed circuit.

20. The electronic device defined in claim 19 further comprising signal lines on the flexible substrate that convey signals from the integrated circuit to the display.

* * * * *